United States Patent
Kaempfe et al.

(10) Patent No.: US 11,121,266 B2
(45) Date of Patent: Sep. 14, 2021

(54) VOLTAGE-CONTROLLABLE CAPACITOR COMPRISING A FERROELECTRIC LAYER AND METHOD FOR PRODUCING THE VOLTAGE-CONTROLLABLE CAPACITOR COMPRISING A FERROELECTRIC LAYER

(71) Applicant: FRAUNHOFER-GESELLSCHAFT ZUR FOERDERUNG DER ANGEWANDTEN FORSCHUNG E.V., Munich (DE)

(72) Inventors: Thomas Kaempfe, Dresden (DE); Patrick Polakowski, Dresden (DE); Konrad Seidel, Dresden (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/530,044

(22) Filed: Aug. 2, 2019

(65) Prior Publication Data
US 2020/0044097 A1     Feb. 6, 2020

(30) Foreign Application Priority Data
Aug. 3, 2018 (DE) ...................... 10 2018 213 051.5

(51) Int. Cl.
*H01L 29/92* (2006.01)
*H01L 29/66* (2006.01)
*H01L 21/02* (2006.01)

(52) U.S. Cl.
CPC ........ *H01L 29/92* (2013.01); *H01L 29/66083* (2013.01); *H01L 21/0228* (2013.01)

(58) Field of Classification Search
CPC ............... H01L 29/92; H01L 29/66083; H01L 21/0228; H01L 28/40
See application file for complete search history.

(56) References Cited

U.S. PATENT DOCUMENTS

| 9,368,392 B2* | 6/2016 | Tseng | H01L 27/0805 |
| 2006/0099722 A1* | 5/2006 | Mitsui | H01L 28/57 |
| | | | 438/3 |
| 2006/0194348 A1* | 8/2006 | Araujo | H01L 27/11502 |
| | | | 438/3 |
| 2016/0064391 A1 | 3/2016 | Li et al. | |
| 2018/0269057 A1* | 9/2018 | Lei | C09D 1/00 |

OTHER PUBLICATIONS

Polakowski et al. Ferroetectric deep trench capacitors based on Al:HfO2 for 3D nonvolatile memory applications. IEEE 6th International Memory Workshop, 2014.
Chernikova et al. Improved ferroelectric switching endurance of La-doped Hf0.5Zr0.5O2 thin films. ACS Appl. Mater. Interfaces 10 (2018), S. 2701-2708.

* cited by examiner

*Primary Examiner* — Karen Kusumakar
(74) *Attorney, Agent, or Firm* — Jacobson Holman, PLLC

(57) ABSTRACT

The present invention relates to a voltage-controllable capacitor comprising a first electrode layer (4) composed of a non-ferroelectric material, said first electrode layer being applied on a substrate (6), a ferroelectric interlayer (3) having a thickness that is less than the thickness of the first electrode layer (4), and a second electrode layer (2) composed of a non-ferroelectric material. The ferroelectric interlayer (3) is arranged between the first electrode layer (4) and the second electrode layer (2).

9 Claims, 1 Drawing Sheet

VOLTAGE-CONTROLLABLE CAPACITOR COMPRISING A FERROELECTRIC LAYER AND METHOD FOR PRODUCING THE VOLTAGE-CONTROLLABLE CAPACITOR COMPRISING A FERROELECTRIC LAYER

The present invention relates to a voltage-controllable capacitor comprising a ferroelectric layer.

Variable-capacitance diodes, alternatively called varicaps, are used as voltage-variable components in electrical or electronic circuits. Varicaps have various disadvantages despite their CMOS (complementary metal-oxide-semiconductor) compatibility and therefore low production costs. Their capacitance-voltage characteristic curves have a nonlinear profile. This results in high losses in radio-frequency applications.

Varicaps additionally have high phase noise, which is likewise disadvantageous for radio-frequency applications. In addition, the characteristic curves are frequency-dependent, which results in more difficult tunability. Variable-capacitance diodes are furthermore not resistant to radiation and therefore in practice cannot be used for aerospace applications. Since high leakage currents occur as well, a use in low-power systems is difficult. On account of the reverse current rising exponentially with temperature, an application for high-temperature systems is also not possible in an expedient way.

As a replacement for varicaps, hitherto use has been made of voltage-variable or voltage-controllable capacitors, so-called varactors, which can be produced more cost-effectively in comparison with ferroelectric capacitors based on materials such as bismuth zinc niobate (BZN). The non-linear tunability, the high phase noise, but also the high frequency dependence and temperature dependence of the capacitance of these capacitors are compensated for by means of complex circuits, which are thus susceptible to errors.

Therefore, the present invention is based on the object of proposing a voltage-controllable capacitor which avoids the disadvantages mentioned, that is to say with which stable operation is made possible with a low control voltage.

This object is achieved according to the invention by means of a voltage-controllable capacitor according to Claim 7. Advantageous configurations and developments are described in the dependent claims.

A voltage-controllable capacitor comprises a first electrode layer composed of a non-ferroelectric material, said first electrode layer being applied on a substrate, typically a semiconductor substrate, a ferroelectric interlayer and a second electrode layer. Said ferroelectric interlayer is arranged between the first electrode layer and the second electrode layer.

By means of a thin ferroelectric layer, a capacitance variation of up to 50 percent can be obtained even for electrical voltages of less than 3 V. The necessary control voltage is thus lower than in available low-voltage solutions. If higher control voltages are advantageous, a DC voltage protection system can be connected in series therewith. The ferroelectric interlayer is CMOS-compatible and implemented as a gate dielectric in conventional CMOS processes. The voltage-controlled capacitor can therefore be produced with low fabrication costs and with a high throughput. The ferroelectric interlayer typically has a thickness that is less than the thickness of the first electrode layer.

Provision can be made for a covering layer, preferably a hard mask, composed of an electrically conductive material to be deposited on the second electrode layer in order to define an electrical contact pad.

The ferroelectric interlayer can be embodied from hafnium oxide ($HfO_2$) doped with silicon, aluminium, germanium, magnesium, calcium, strontium, barium, titanium, zirconium, one or a plurality of rare earth elements, that is to say scandium, lanthanum, cerium, praseodymium, neodymium, promethium, samarium, europium, yttrium, gadolinium, terbium, dysprosium, holmium, erbium, thulium, ytterbium, lutetium as dopant, or undoped hafnium oxide, or can at least comprise one of the chemical elements mentioned or that is to say doped or undoped hafnium oxide. The ferroelectric interlayer can also be embodied from zirconium oxide ($ZrO_2$) doped with silicon, aluminium, germanium, magnesium, calcium, strontium, barium, titanium, one or a plurality of rare earth elements, that is to say scandium, lanthanum, cerium, praseodymium, neodymium, promethium, samarium, europium, yttrium, gadolinium, terbium, dysprosium, holmium, erbium, thulium, ytterbium, lutetium as dopant, or undoped zirconium oxide, or can at least comprise one of the chemical elements mentioned or that is to say doped or undoped zirconium oxide. The elements and materials mentioned are suitable for a conformal embodiment of layers. In this case, the materials used for the ferroelectric capacitor are typically lead-free and RHoS-compliant (that is to say comply with EU Directive 2011/65/EU).

Typically, at least one, but preferably each, of the applied layers, that is to say the first electrode layer, the ferroelectric interlayer, the second electrode layer and, if provided, the covering layer, is embodied as a conformal layer which covers the underlying layer, with which it is in immediate, that is to say direct, contact, without cutouts or holes (if appropriate apart from an edge region).

In order to increase a breakdown strength, provision can be made for the ferroelectric interlayer to be embodied in multi-layered fashion and to comprise at least one layer composed of an oxide layer having a thickness of less than 3 nm and a hafnium oxide layer or a zirconium oxide layer having a thickness of between 3 nm and 20 nm. This configuration, also referred to as "ultralaminate", increases not only the breakdown voltage but also the switching voltage, for example by a factor of 5. The switching voltage can thereby be increased for example to 5 V. For high-voltage applications, alternating series driving of the ferroelectric capacitors can additionally be effected. On account of the CMOS compatibility of hafnium oxide ($HfO_2$) and of zirconium oxide ($ZrO_2$) and of the dopants mentioned, it is thus possible to fabricate further electronics on the same substrate, that is to say fabrication on-chip. The device described can be produced as an individual miniaturized SMD device (surface mounted device), such that even extremely small designs such as the 01005 format can be implemented. The oxide layer can be embodied as an aluminium oxide layer, a silicon oxide layer and/or a zirconium oxide layer.

Provision can be made for the ferroelectric interlayer to be embodied with a thickness of less than 100 nm, preferably less than 40 nm. The capacitance density of such thin layers is approximately 10 $\mu F/cm^2$. The change in capacitance behaves linearly with respect to the applied voltage, wherein the loss factor is very low. This high linearity is very advantageous for RF (radio-frequency) applications since lower losses arise as a result.

The first electrode layer and/or the second electrode layer are/is typically composed of an electrically conductive material that is able to be deposited well, preferably a metal, in particular titanium nitride (TiN), platinum (Pt) or ruthenium oxide ($RuO_2$ or $RuO_4$) in order to ensure a sufficiently high electrical conductivity. The first electrode layer and the second electrode layer can be embodied from the same material, but provision can also be made for these layers alternatively to be constructed from different materials.

In a method for producing a voltage-controllable capacitor, a first electrode layer composed of a non-ferroelectric material is applied on a substrate. A ferroelectric interlayer is deposited on the first electrode layer. The second electrode layer is applied on the ferroelectric interlayer. In this case, the thickness of the ferroelectric interlayer is preferably less than the thickness of the first electrode layer.

Preferably, the first electrode layer and the second electrode layer are applied by means of atomic layer deposition (ALD) or chemical vapour deposition (CVD) in order to achieve an efficient coating having the desired technical parameters.

Provision can be made for applying the ferroelectric layer by means of atomic layer deposition, in particular by means of atomic layer deposition comprising alternating deposition cycles of a dielectric material and a dopant.

The substrate used can be highly doped silicon, which has a sufficiently high electrical conductivity and at the same time can be structured well.

The method described is embodied for producing the voltage-controllable capacitor described, that is to say that the voltage-controllable capacitor described can be produced by the method described.

Exemplary embodiments of the invention are illustrated in the drawings and are explained below with reference to FIGS. 1 and 2.

IN THE FIGURES

Figure 1:
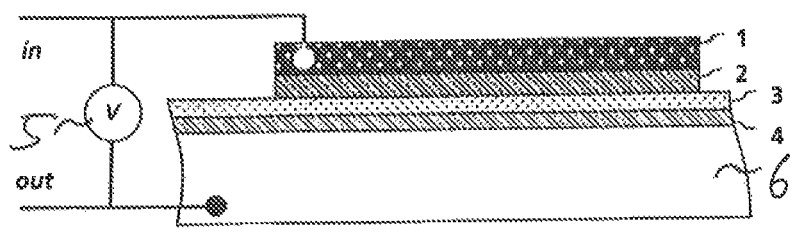
FIG. 1 shows a schematic lateral view of a voltage-controllable capacitor.

A voltage-controllable capacitor is illustrated in a schematic lateral view in FIG. 1. On a semiconductor substrate 6 composed of highly doped silicon, a first electrode layer 4 composed of titanium nitride is deposited on a planar outer surface of the substrate 6. A ferroelectric interlayer 3 embodied from doped hafnium oxide is applied on the first electrode layer 4, likewise in a planar configuration. In this case, the ferroelectric interlayer 3 can be applied as doped or undoped hafnium oxide or zirconium oxide. Optionally, a layer-by-layer or ply-by-ply deposition of hafnium oxide or zirconium oxide followed by a further oxide layer is effected, thus resulting in an alternating layer construction, a so-called ultralaminate. In this case, the ferroelectric interlayer 3 completely covers the first electrode layer 4, but is itself covered only partly by a second electrode layer 2. Finally, a hard mask 1 composed of an electrically conductive material is applied in a manner covering the first electrode layer 2. The hard mask 1 has a thickness of typically 10 nm to 1000 nm.

The first electrode layer 4 is applied conformally by means of atomic layer deposition, that is to say in such a way that no holes or cavities remain in the layer. Likewise by means of atomic layer deposition, the ferroelectric interlayer 3 is applied conformally, with use being made of alternating atomic layer deposition cycles for hafnium oxide or zirconium oxide and a corresponding dopant, for example silicon. In further exemplary embodiments, the hafnium oxide or zirconium oxide can also be applied in undoped fashion. In this case, a thickness of the ferroelectric interlayer 3 is less than 100 nm and, in particular, less than the thickness of the first electrode layer 4, which is 10 nm in the exemplary embodiment illustrated.

The second electrode layer 2 is likewise applied by atomic layer deposition with a thickness of 5 nm to 500 nm, preferably 10 nm to 30 nm, in a conformal configuration. The thickness of the first electrode layer 4 and the thickness of the second electrode layer 2 can be identical, but the two thicknesses can also deviate from one another. The hard mask 1 can finally be structured and finalized by means of lithography and etching and cleaning. A voltage source 5 can be embodied in an electrically conductively connected manner likewise on the substrate 6 between the hard mask 1 and the substrate 6 or between the second electrode layer 2 and the substrate 6. The capacitance of the varactor thus produced is frequency-independent for frequencies of up to approximately 80 GHz and is therefore usable both for 5G circuits and for radar circuits. The temperature dependence, by contrast, is lower than in other voltage-variable capacitors. Likewise, only little phase noise is observed.

Figure 2:
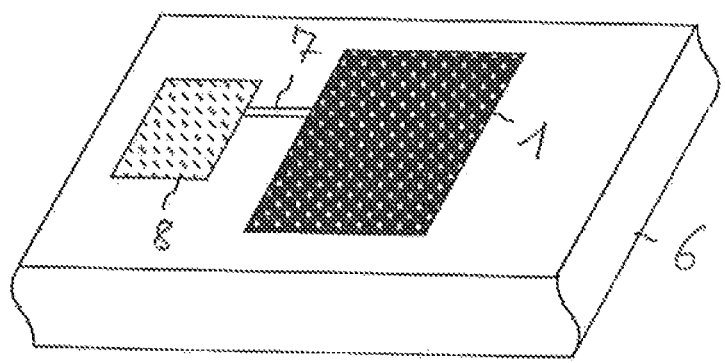
FIG. 2 shows a perspective view of the voltage-controllable capacitor with further control electronics.

FIG. 2 illustrates, in a perspective view, the substrate 6 with the hard mask 1 as surface of the voltage-controllable capacitor situated underneath. In this figure, recurring features are provided with reference signs identical to those in FIG. 1. Control electronics 8 are additionally arranged on the substrate 6, said control electronics being in electrical contact with the hard mask 1 via an electrically conductive connection 7. In order to ensure DC protection, the voltage-controllable capacitor described can also be operated in a series-connected manner. As a result, very high DC voltages can be applied to the voltage-controllable capacitor and a decoupling of the control voltage from the input or RF signal to be controlled is made possible.

Features of the various embodiments that are disclosed only in the exemplary embodiments can be claimed in combination with one another and individually.

The invention claimed is:

1. A voltage-controllable capacitor comprising
   a first electrode layer composed of a non-ferroelectric material, said first electrode layer being applied on a substrate,
   a ferroelectric interlayer,
   a second electrode layer composed of a non-ferroelectric material, and
   a covering layer composed of an electrically conductive material is deposited on and only in contact with the second electrode layer,
   wherein the ferroelectric interlayer is arranged between the first electrode layer and the second electrode layer;
   wherein the ferroelectric interlayer is applied on the first electrode layer in a planar configuration and completely covers the first electrode layer; and
   wherein the ferroelectric interlayer is covered only partly by the second electrode layer.

2. The voltage-controllable capacitor according to claim 1, wherein the covering layer is a hard mask.

3. The voltage-controllable capacitor according to claim 1, characterized in that the ferroelectric interlayer is embodied from hafnium oxide doped with silicon, aluminium, germanium, magnesium, calcium, strontium, barium, titanium, rare earth element, or undoped hafnium oxide or from zirconium oxide ($ZrO_2$) doped with silicon, aluminium, germanium, magnesium, calcium, strontium, barium, titanium, a rare earth element, or undoped zirconium oxide, or at least comprises one of the chemical elements mentioned.

4. The voltage-controllable capacitor according to claim 1, characterized in that the ferroelectric interlayer is embodied in multi-layered fashion and comprises at least one layer composed of an oxide layer having a thickness of less than 3 nm and a hafnium oxide layer having a thickness of between 3 nm and 20 nm.

5. The voltage-controllable capacitor according to claim 1, characterized in that the ferroelectric interlayer is embodied with a thickness of less than 50 nm.

6. The voltage-controllable capacitor according to claim 1, characterized in that the first electrode layer and/or the second electrode layer are/is embodied from titanium nitride, ruthenium oxide and/or platinum.

7. A method for producing a voltage-controllable capacitor, wherein
a first electrode layer composed of a non-ferroelectric material is applied on a substrate,
a ferroelectric interlayer is applied on the first electrode layer,
a second electrode layer is applied on the ferroelectric interlayer; and
a covering layer composed of an electrically conductive material is deposited on and only in contact with the second electrode layer,
wherein the ferroelectric interlayer is applied on the first electrode layer in a planar configuration and completely covers the first electrode layer; and
wherein the ferroelectric interlayer is covered only partly by the second electrode layer.

8. The method according to claim 7, characterized in that the first electrode layer is deposited on a planar surface of the substrate by means of atomic layer deposition or chemical vapour deposition.

9. The method according to claim 7, characterized in that the ferroelectric interlayer is applied by means of atomic layer deposition comprising alternating deposition cycles of a dielectric material and a dopant.

* * * * *